(12) United States Patent
Sun et al.

(10) Patent No.: US 11,793,022 B2
(45) Date of Patent: Oct. 17, 2023

(54) ORGANIC LIGHT-EMITTING DISPLAY PANEL WITH ISOLATION PART

(71) Applicants: Chengdu BOE Optoelectronics Technology Co., Ltd., Chengdu (CN); BOE Technology Group Co., Ltd., Beijing (CN)

(72) Inventors: Kuo Sun, Beijing (CN); Chunyan Xie, Beijing (CN); Pan Zhao, Beijing (CN); Wenbo Hu, Beijing (CN); Xiaoliang Guo, Beijing (CN); Jianpeng Wu, Beijing (CN); Jian He, Beijing (CN); Song Zhang, Beijing (CN); Pinfan Wang, Beijing (CN); Penghao Gu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 105 days.

(21) Appl. No.: 17/054,218

(22) PCT Filed: Mar. 18, 2020

(86) PCT No.: PCT/CN2020/079976
§ 371 (c)(1),
(2) Date: Nov. 10, 2020

(87) PCT Pub. No.: WO2020/187262
PCT Pub. Date: Sep. 24, 2020

(65) Prior Publication Data
US 2021/0159456 A1 May 27, 2021

(30) Foreign Application Priority Data
Mar. 19, 2019 (CN) .......................... 201910209398.2

(51) Int. Cl.
*H10K 50/844* (2023.01)
*H10K 59/124* (2023.01)
(Continued)

(52) U.S. Cl.
CPC ......... *H10K 50/844* (2023.02); *H10K 59/124* (2023.02); *H10K 71/00* (2023.02);
(Continued)

(58) Field of Classification Search
CPC . H01L 27/3258; H01L 51/5253; H01L 51/56; H01L 51/0097; H01L 2227/323;
(Continued)

(56) References Cited

U.S. PATENT DOCUMENTS 10,014,491 B2 7/2018 Park
10,396,311 B2 8/2019 Lee et al.
(Continued)

FOREIGN PATENT DOCUMENTS

CN 106887523 A 6/2017
CN 107017277 A 8/2017
(Continued)

OTHER PUBLICATIONS

First Office Action, including Search Report, for Chinese Patent Application No. 201910209398.2, dated Aug. 5, 2020, 16 pages.

*Primary Examiner* — Lex H Malsawma
*Assistant Examiner* — Eric W Jones
(74) *Attorney, Agent, or Firm* — Westman, Champlin & Koehler, P.A.

(57) ABSTRACT

The present disclosure provides an organic light-emitting display panel, a method of manufacturing the organic light-emitting display panel, and a display apparatus. The organic light-emitting display panel includes: a substrate having an opening passing through the substrate; a pixel array disposed on the substrate and including a plurality of pixels; an isolation part disposed between the plurality of pixels and the opening and surrounding the opening, wherein the isolation part includes: a first layer disposed on the substrate, wherein the first layer includes a first portion and a second
(Continued)

portion which are sequentially stacked in a direction away from the substrate, and an orthogonal projection of the first portion on the substrate falls within an orthogonal projection of the second portion on the substrate; and a second layer disposed on a surface of the first layer away from the substrate.

13 Claims, 5 Drawing Sheets

(51) Int. Cl.
    *H10K 71/00*     (2023.01)
    *H10K 59/12*     (2023.01)
    *H10K 77/10*     (2023.01)
    *H10K 102/00*     (2023.01)

(52) U.S. Cl.
    CPC ........ *H10K 59/1201* (2023.02); *H10K 77/111* (2023.02); *H10K 2102/311* (2023.02)

(58) Field of Classification Search
    CPC .......... H01L 2251/5338; H10K 50/844; H10K 71/00; H10K 59/124; H10K 59/1201; H10K 2102/311; H10K 77/111
    USPC ...................................................... 257/40, 59
    See application file for complete search history.

(56) References Cited

U.S. PATENT DOCUMENTS

| | | | |
|---|---|---|---|
| 10,644,261 B2 | 5/2020 | Lee et al. | |
| 2011/0241027 A1 | 10/2011 | Kaneta et al. | |
| 2014/0159002 A1* | 6/2014 | Lee | H01L 51/56 |
| | | | 438/34 |
| 2015/0102293 A1* | 4/2015 | Cho | H01L 33/56 |
| | | | 257/40 |
| 2015/0325634 A1* | 11/2015 | Chao | G02F 1/136286 |
| | | | 257/40 |
| 2017/0110532 A1* | 4/2017 | Kim | H01L 51/0096 |
| 2017/0117502 A1 | 4/2017 | Park | |
| 2017/0148856 A1 | 5/2017 | Choi et al. | |
| 2017/0373129 A1* | 12/2017 | Kim | H01L 29/78645 |
| 2019/0074479 A1 | 3/2019 | Lee et al. | |
| 2019/0081273 A1 | 3/2019 | Sung et al. | |
| 2019/0348633 A1 | 11/2019 | Lee et al. | |
| 2020/0259121 A1 | 8/2020 | Lee et al. | |

FOREIGN PATENT DOCUMENTS

| | | |
|---|---|---|
| CN | 107452894 A | 12/2017 |
| CN | 107768533 A | 3/2018 |
| CN | 109427861 A | 3/2019 |
| CN | 109904208 A | 6/2019 |
| CN | 110416282 A | 11/2019 |
| EP | 3454389 A1 | 3/2019 |

\* cited by examiner

ORGANIC LIGHT-EMITTING DISPLAY PANEL WITH ISOLATION PART

CROSS-REFERENCE TO RELATED APPLICATION

This application is a Section 371 National Stage Application of International Application No. PCT/CN2020/079976, filed on Mar. 18, 2020, entitled "ORGANIC LIGHT-EMITTING DISPLAY PANEL, METHOD OF MANUFACTURING ORGANIC LIGHT-EMITTING DISPLAY PANEL AND DISPLAY APPARATUS", which claims priority to Chinese Patent Application No. 2019102093982, filed with the National Intellectual Property Administration of China on Mar. 19, 2019, the disclosures of which are incorporated herein by reference in their entireties.

TECHNICAL FIELD

The present disclosure relates to the field of display technology, and particularly to an organic light-emitting display panel, a method of manufacturing the organic light-emitting display panel, and a display apparatus.

BACKGROUND

With the increasing demand for a large screen ratio of an organic light-emitting display apparatus, it is necessary to realize perforating in a light emitting region of a screen to accommodate necessary front functional components such as a camera and a sensor. Therefore, the perforating technology of the display region has been widely valued. Since the organic light-emitting display panel is very susceptible to oxygen and water vapor, the water and oxygen that penetrates into a light emitting layer will seriously affect a light emitting life of a device. Therefore, after perforating is carried out in the display region, how to isolate a hole region (TH) from an effective display region (AA) to ensure the reliability of the packaging has become a problem to be solved urgently.

It is to be noted that the information disclosed above in the background is only used to enhance understanding of the background of the present disclosure, and therefore may include information in the related art which does not constitute that known by those of ordinary skill in the art.

SUMMARY

In accordance with an aspect of the present disclosure, there is provided an organic light-emitting display panel including:
  a substrate having an opening passing through the substrate;
  a pixel array disposed on the substrate and including a plurality of pixels;
  an isolation part disposed between the plurality of pixels and the opening and surrounding the opening,
  wherein the isolation part includes:
  a first layer disposed on the substrate, wherein the first layer includes a first portion and a second portion which are sequentially stacked in a direction away from the substrate, and an orthogonal projection of the first portion on the substrate falls within an orthogonal projection of the second portion on the substrate; and
  a second layer disposed on a surface of the first layer away from the substrate.

In some embodiments, the isolation part further includes a metal layer disposed on two sides of the first portion of the first layer in a direction parallel to the substrate, and the metal layer and a first metal layer of the plurality of pixels are the same metal layer.

In some embodiments, the metal layer is a titanium layer.

In some embodiments, the metal layer includes three metal sub-layers, the three metal sub-layers include a first metal sub-layer, a second metal sub-layer, and a third metal sub-layer which are sequentially arranged in the direction away from the substrate, a material of the first metal sub-layer is titanium, a material of the second metal sub-layer is aluminum, and a material of the third metal sub-layer is titanium.

In some embodiments, the metal layer includes two metal sub-layers sequentially arranged in the direction away from the substrate and separated from each other.

In some embodiments, the isolation part further includes a protective layer disposed between the metal layer and the first layer.

In some embodiments, a separation distance between the second portion and the substrate is greater than a thickness of a light emitting layer of the organic light-emitting display panel.

In some embodiments, the organic light-emitting display panel further includes a frame sealing part disposed between the pixel array and the isolation part.

In some embodiments, a material of the first layer includes at least one of $SiO_2$, $SiN_x$, $SiON$, $Al_2O_3$, $TiO_2$, $Ta_2O_5$, $HfO_2$, or $ZnO$.

In some embodiments, a material of the second layer is an organic material.

In some embodiments, the first layer is an interlayer dielectric layer, and the second layer is a planarization layer.

In accordance with another aspect of the present disclosure, there is provided a display apparatus including the above organic light-emitting display panel.

In accordance with a further aspect of the present disclosure, there is provided a method of manufacturing an organic light-emitting display panel, including:
  providing a substrate having a first region, a third region, and a second region between the first region and the third region;
  forming a plurality of pixels in the first region;
  forming an isolation part in the second region, the isolation part including: a first layer disposed on the substrate; and a second layer disposed on a surface of the first layer away from the substrate, wherein the first layer includes a first portion and a second portion which are sequentially stacked in a direction away from the substrate, and an orthogonal projection of the first portion on the substrate falls within an orthogonal projection of the second portion on the substrate; and
  forming an opening passing through the substrate in the third region.

In some embodiments, the steps of forming the plurality of pixels and the isolation part include:
  forming a metal layer on the substrate, the metal layer in the first region being formed into a gate electrode layer of the plurality of pixels;
  forming a channel passing through the metal layer in the metal layer in the second region;
  forming the first layer on the metal layer in the first region and the second region and in the channel; and
  forming the second layer on the first layer.

In some embodiments, the method further includes: etching an anode layer in the first region and the metal layer in the second region.

In some embodiments, the step of forming the first layer on the metal layer in the first region and the second region and in the channel includes: forming a protective layer on the metal layer in the second region before forming the first layer.

In some embodiments, the step of forming the first layer on the metal layer in the first region and the second region includes: forming the first layer such that a separation distance between the second portion and the substrate is greater than a thickness of a light emitting layer of the organic light-emitting display panel.

BRIEF DESCRIPTION OF THE DRAWINGS

The drawings herein are incorporated into the specification and constitute a part of the specification, show embodiments that conform to the present disclosure, and together with the specification are used to explain the principle of the present disclosure. Apparently, the drawings for the following description are only some embodiments of the present disclosure. Those skilled in the art could also derive other drawings from these drawings without making a creative work.

DETAILED DESCRIPTION

Exemplary embodiments will now be described more fully with reference to the drawings. However, the exemplary embodiments can be implemented in various forms, and should not be construed as being limited to the examples set forth herein. On the contrary, these embodiments are provided such that the present disclosure will be more comprehensive and complete, and the concept of the exemplary embodiments is fully conveyed to those skilled in the art. Features, structures or characteristics to be described may be combined in any appropriate manner in one or more embodiments.

Furthermore, the drawings are only schematic illustrations of the present disclosure, and are not necessarily plotted to scale. The same or similar components are indicated by the same reference signs in the drawings and thus their repeated description will be omitted.

Figure 1:
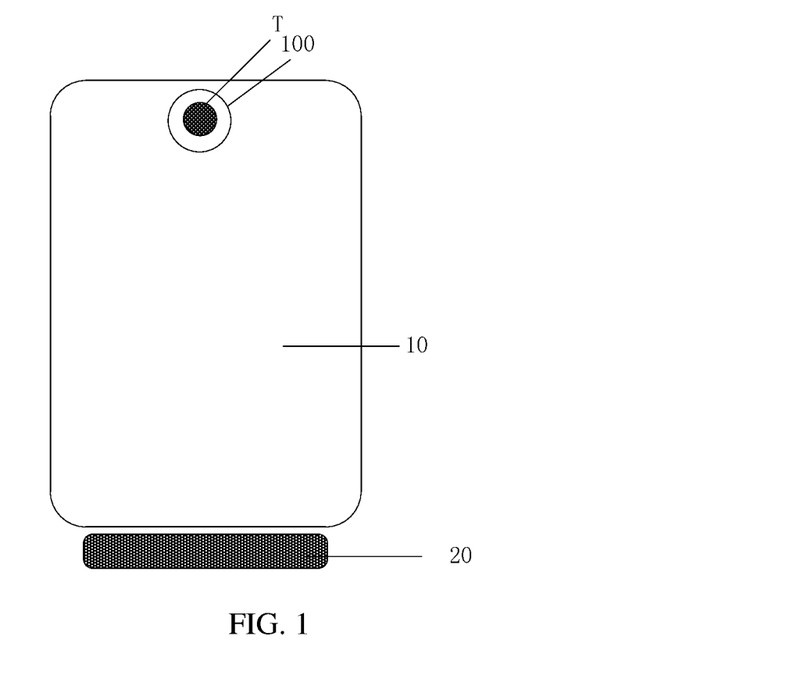
FIG. 1 is a plan view illustratively showing an organic light-emitting display panel in related art.

FIG. 1 is a plan view illustratively showing an organic light-emitting display panel in related art. As shown in FIG. 1, the organic light-emitting display panel includes a display region 10 and a driver IC region 20. The display region 10 is provided with an opening T. In the opening T, devices such as a camera and a sensor may be disposed to meet the demand for the large screen ratio.

In the related art, the organic light-emitting display panel includes a substrate, a buffer layer disposed on the substrate, and various regions on the buffer layer. An effective display region of the organic light-emitting display panel includes a pixel region, an opening, and an isolation region.

In order to avoid the influence of water vapor and oxygen entering from the opening region on the pixel region in the effective display region, the isolation region is disposed between the opening region and the pixel region, and the isolation region is disposed around the opening T.

An isolation part 100 disposed in the isolation region generally includes: a gate electrode metal layer on the buffer layer, an interlayer dielectric layer (ILD) disposed on the gate electrode metal layer, and a planarization Layer (PLN) disposed on the interlayer dielectric layer. The gate electrode metal layer, the interlayer dielectric layer, and the planarization layer are all formed in the same layer as a pixel structure in the pixel region A3. In the process of manufacturing an organic light-emitting display device, while the pixel structure is formed, a light emitting (EL) material layer is also formed on an isolation column A. The light-emitting material layer is an organic material, and water vapor and oxygen and the like easily enter the pixel region A3 through the light emitting material layer to affect light emission. It needs to be effectively isolated.

Figure 2:
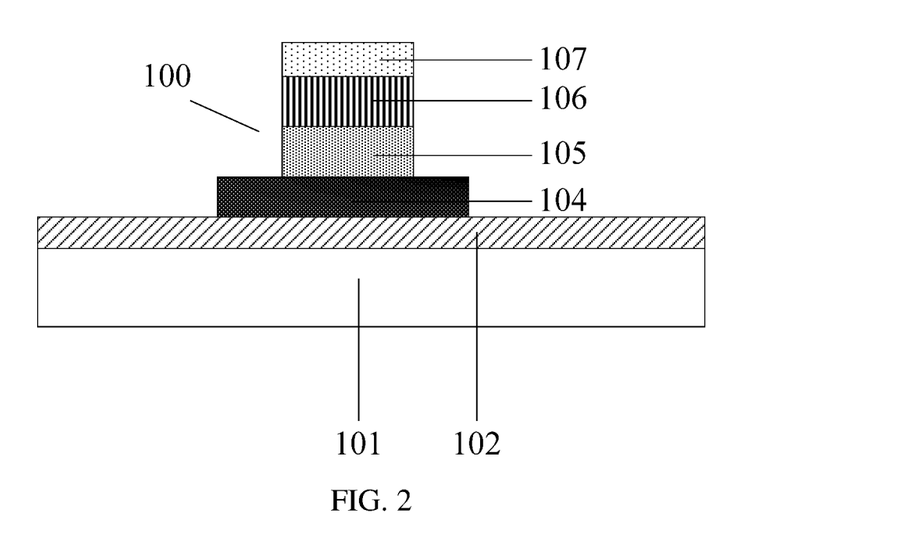
FIG. 2 is a schematic view illustratively showing a structure of an isolation column before being etched in the related art.
Figure 3:
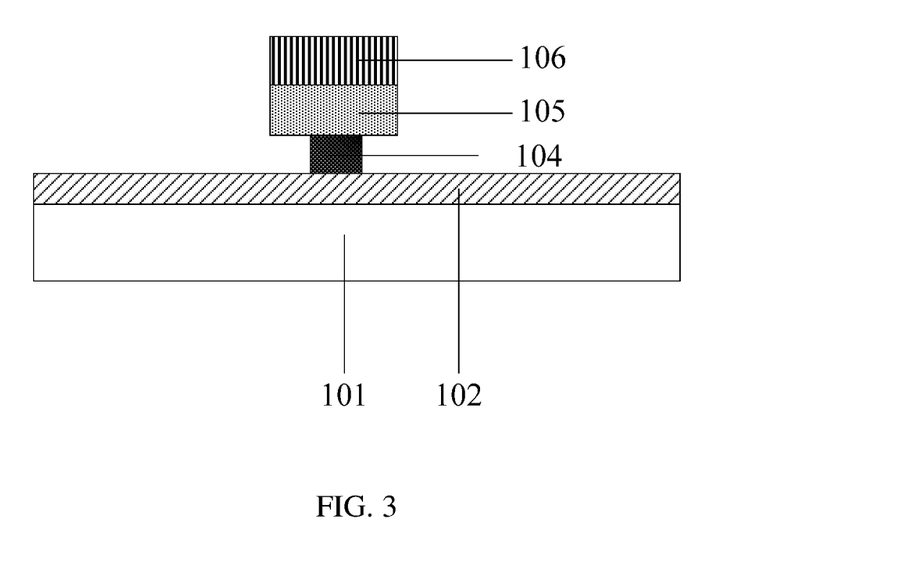
FIG. 3 is a schematic view illustratively showing a structure of the isolation column subsequent to being etched in the related art.

In the related art, the isolation part 100 in the isolation region A1 is usually design as the isolation column 100. A schematic view of its structure is as shown in FIGS. 2-3. FIG. 2 is a schematic view illustratively showing a structure of the isolation column before being etched in the related art. FIG. 3 is a schematic view illustratively showing a structure of the isolation column subsequent to being etched in the related art.

In the related art, the isolation column before being etched includes: a gate electrode metal layer 104 on the buffer layer 102, an interlayer dielectric layer (ILD) 105 disposed on the gate electrode metal layer 104, and a planarization Layer (PLN) 106 disposed on the interlayer dielectric layer (ILD) 105.

After the above structure is formed, in a wet etching process, the gate electrode metal layer 104 is etched away while an anode is etched, to obtain the structure of the etched isolation column as shown in FIG. 3. A part of the gate electrode metal layer 104 is etched away, and the remaining gate metal layer 104, together with the interlayer dielectric layer 105 and the planarization layer 106 disposed on the remaining gate metal layer 104, forms the final isolation column for isolation, preventing water vapor and oxygen brought by the opening region from entering the pixel region through the light emitting material layer 107 to affect light emission.

In the wet etching process, under different etching conditions, a laterally etching width is not easily controlled, which easily causes a poor isolation effect of the isolation column. Therefore, the structure of the isolation column needs to be improved.

In order to solve the above problem, embodiments of the present disclosure provide a new structure of the isolation column which can ensure an excellent isolation effect while the lateral etching width is freely designed.

Figure 4:
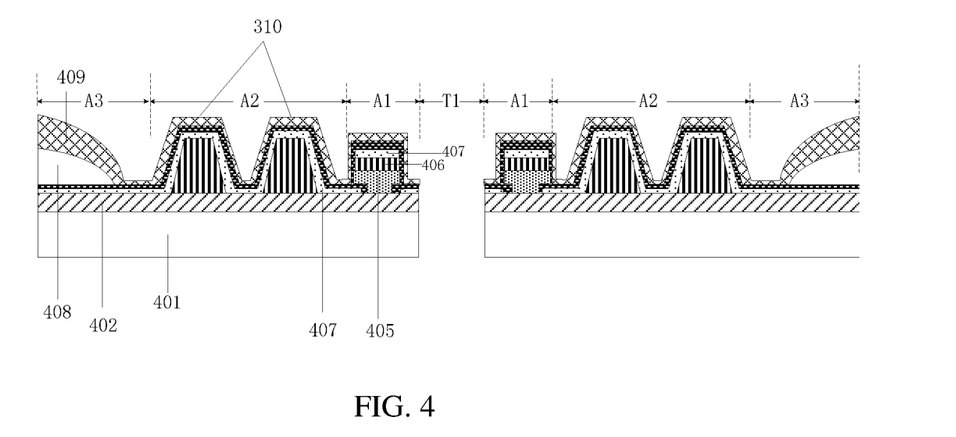
FIG. 4 is a section view illustratively showing an organic light-emitting display panel according to an embodiment of the present disclosure.

Embodiments of the present disclosure provide a structure of the isolation column. FIG. 4 is a section view illustratively showing an organic light-emitting display panel according to an embodiment of the present disclosure. FIG. 4 shows an effective display region of the organic light-emitting display panel, which includes a structure of the isolation column provided by the embodiment of the present disclosure.

As shown in FIG. 4, the organic light-emitting display panel according to the embodiment of the present disclosure includes: a substrate 401 which may be a flexible substrate made of polyimide (PI) or the like; and a buffer layer 402 disposed on the substrate 401. An opening T1 passes through the substrate 401 and the buffer layer 402. A pixel array including a plurality of pixels is disposed on the substrate 401 and is located in a pixel region (A3) in FIG. 4. The plurality of pixels are not specifically shown in FIG. 4, and are located below encapsulation layers 408 and 409. An isolation part 100 is disposed between the plurality of pixels and the opening and is located in a region A1. The isolation part 100 surrounds the opening, and the isolation part 100 is designed as an isolation column, and includes a first layer, i.e. an interlayer dielectric layer 405, and a second layer, i.e. a planarization layer 406, disposed on the interlayer insulating layer 405. The first layer 405 includes a first portion 405(1) and a second portion 405(2) sequentially stacked in a direction away from the substrate, and an orthogonal projection of the first portion on the substrate falls within an orthogonal projection of the second portion on the substrate.

A material of the interlayer dielectric layer 405 is an inorganic material layer and may include SiO2, SiNx, SiON, Al2O3, TiO2, Ta2O5, HfO2, and/or ZnO, and the like.

A material of the planarization layer 406 is usually an organic material layer, but may also be the same as a material of the interlayer dielectric layer 405.

There is also a DAM (frame sealing) region A2 between the isolation part region A1 and the pixel region A3. The DAM region includes a frame sealing part 310 and is mainly composed of the interlayer dielectric layer 405.

A protective layer (PVX layer) may also be disposed on a side surface of the interlayer dielectric layer 405 to block water vapor better.

The organic light-emitting display panel includes a light emitting (EL) material layer 407 formed over the entire effective display region (AA). The light emitting material layer 407 is an organic material, and water vapor and oxygen entering from the opening easily enter the pixel region A3 through the light emitting material layer 407 to affect light emission. Therefore, in the embodiments of the present disclosure, a height of the planarization layer 406 is set to be greater than a thickness of the light emitting material layer 407 to achieve a better effect of blocking water vapor and oxygen.

Compared with the related art, the structure of the isolation column provided by the embodiments of the present disclosure has the interlayer dielectric layer and the planarization layer, so that in the process of subsequently etching the anode, since an etching solution used to etch the anode will not corrode the interlayer dielectric layer, the laterally etching width can be easily controlled and thus can be freely designed to ensure the isolation effect of the isolation column.

Embodiments of the present disclosure further provide a method of manufacturing the above organic light-emitting display panel. The method includes the following steps: firstly providing a substrate, dividing the substrate into a first region A3, a third region T1, and a second region A2 between the first region A3 and the third region T1, forming a plurality of pixels in the first region A3, and forming an isolation part 100 in the second region; and forming an opening passing through the substrate in the third region.

The steps of forming the plurality of pixels and the isolation part include: forming a metal layer 404 on the substrate, the metal layer in the first region being formed into a gate electrode metal layer of the plurality of pixels; forming a channel passing through the metal layer in the metal layer in the second region; and filling a dielectric material on the metal layer in the first region and the second region and in the channel to form an interlayer dielectric layer 405 and forming a planarization layer 406 on the interlayer dielectric layer. Thereby, the structure of the isolation column as shown in FIG. 5 is obtained.

Figure 5:
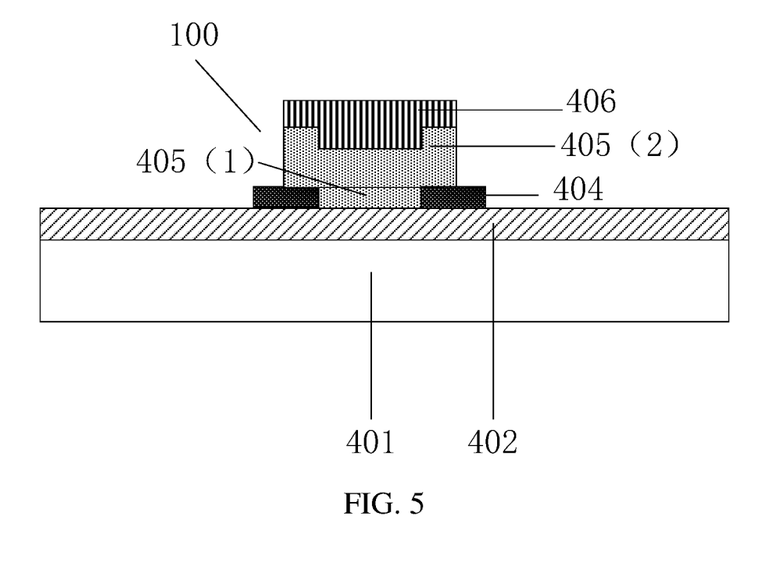
FIG. 5 is a schematic view illustratively showing a structure of an isolation column before being etched according to an embodiment of the present disclosure.

FIG. 5 is a schematic view showing a structure of the isolation column before being etched. In this structure, the gate electrode metal layer 404 is not connected together, but is separated by the interlayer dielectric layer 405. In the process of subsequently etching the anode, a wet etching solution will etch only the metal layer without corroding the interlayer dielectric layer 405. The etching process will automatically stop after the etching of the gate electrode metal layer 405 is completed, leaving the interlayer dielectric layer 405 as the main structure of the isolation column, which solves the problem that the laterally etching width cannot be easily controlled when the anode and the gate electrode metal layer are etched simultaneously.

Figure 6:
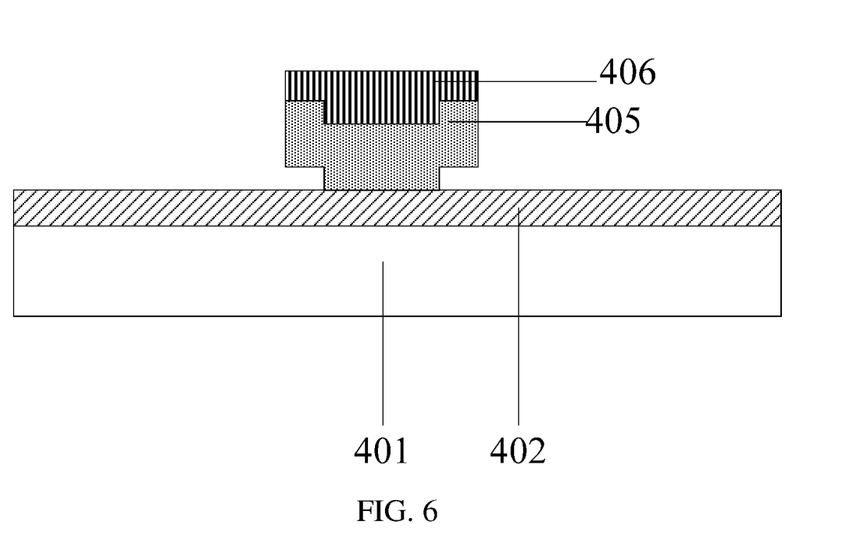
FIG. 6 is a schematic view illustratively showing a structure of the isolation column subsequent to being etched according to the embodiment of the present disclosure.

FIG. 6 is a schematic view showing a structure of the isolation column subsequent to being etched. The isolation column includes the interlayer dielectric layer 405 and the planarization Layer 406 disposed on the interlayer dielectric layer 405.

Figure 7:
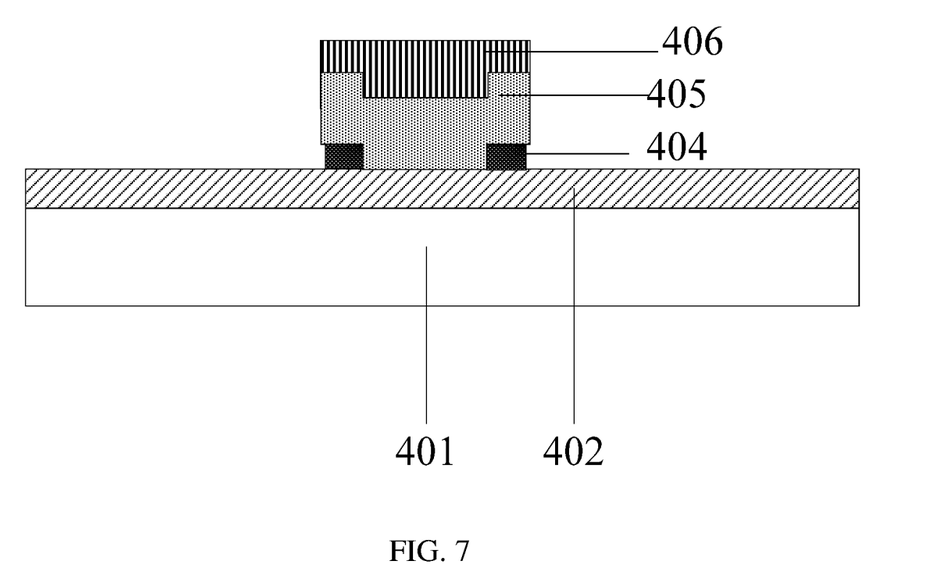
FIG. 7 is a schematic view illustratively showing a structure of another isolation column subsequent to being etched according to an embodiment of the present disclosure, in which a metal layer on both sides is shown.

In another embodiment, as shown in FIG. 7, FIG. 7 is a schematic view illustratively showing a structure of another isolation column subsequent to being etched according to the embodiment of the present disclosure. In another case, since the gate electrode metal layer is not completely corroded away in the process of etching the anode and the gate electrode metal layer, a part of the gate electrode metal layer 404 is retained. The part of the gate electrode metal layer 404 is disposed on both sides of the interlayer dielectric layer 405. The gate electrode metal layer 404, together with the interlayer dielectric layer 405 and the planarization layer 406, forms the isolation column of the embodiment of the present disclosure. The gate electrode metal layer 404 and the gate electrode metal layer of the plurality of pixels in the pixel region are the same metal layer formed in the same process. For example, the metal layer 404 is an aluminum layer.

Figure 8:
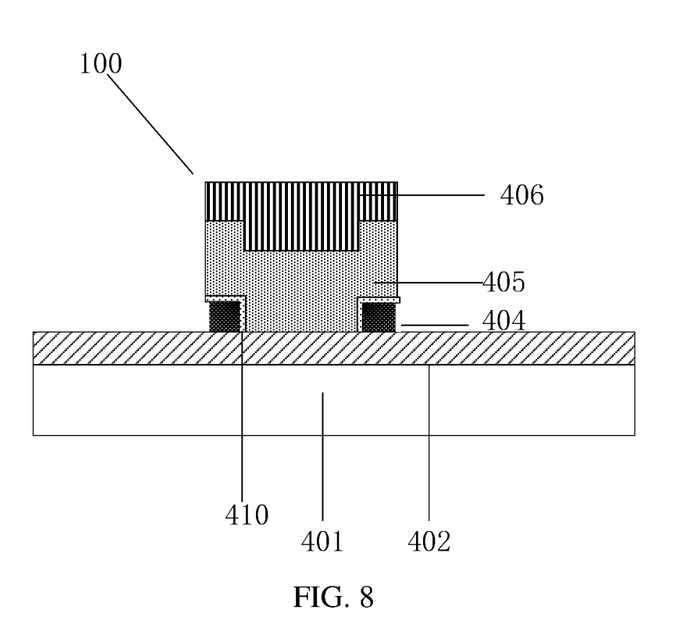
FIG. 8 is a schematic view illustratively showing a structure of another isolation column subsequent to being etched according to an embodiment of the present disclosure, in which a protective layer between a metal layer and an interlayer dielectric layer is shown.

In another embodiment, as shown in FIG. 8, FIG. 8 is a schematic view illustratively showing a structure of another isolation column subsequent to being etched according to the embodiment of the present disclosure. In this embodiment, before the interlayer dielectric layer is formed, a protective layer is formed on the metal layer in the second region and in the channel. In this way, the protective layer 410 is disposed between the metal layer 404 and the interlayer dielectric layer 405 to further block water vapor, improving the isolating effect.

Figure 9:
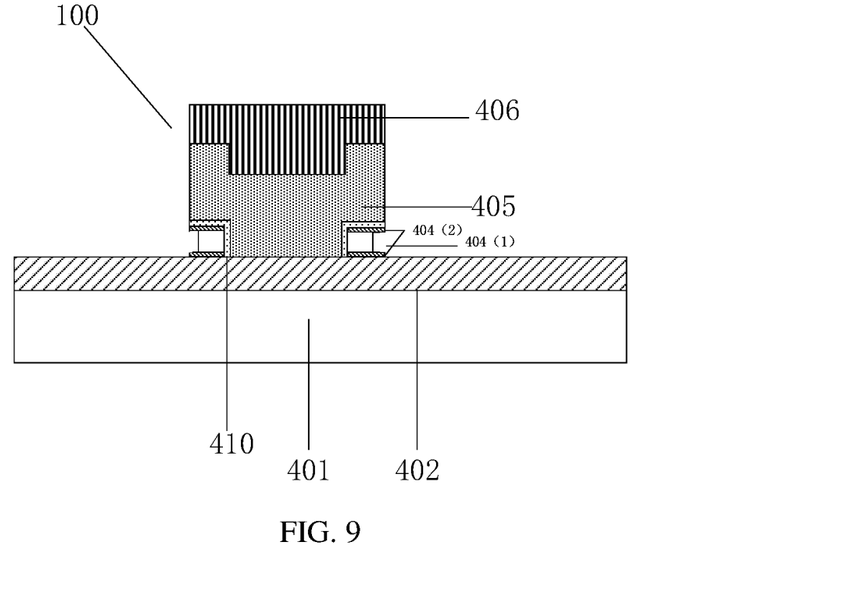
FIG. 9 is a schematic view illustratively showing a structure of another isolation column subsequent to being etched according to an embodiment of the present disclosure, in which a metal layer having a three-layered structure is shown.

In another embodiment, as shown in FIG. 9, the metal layer 406 is a three-layered structure. A specific material of the metal layer 406 is a titanium 404(2)-aluminum 404(1)-titanium 404(2) laminate.

Figure 10:
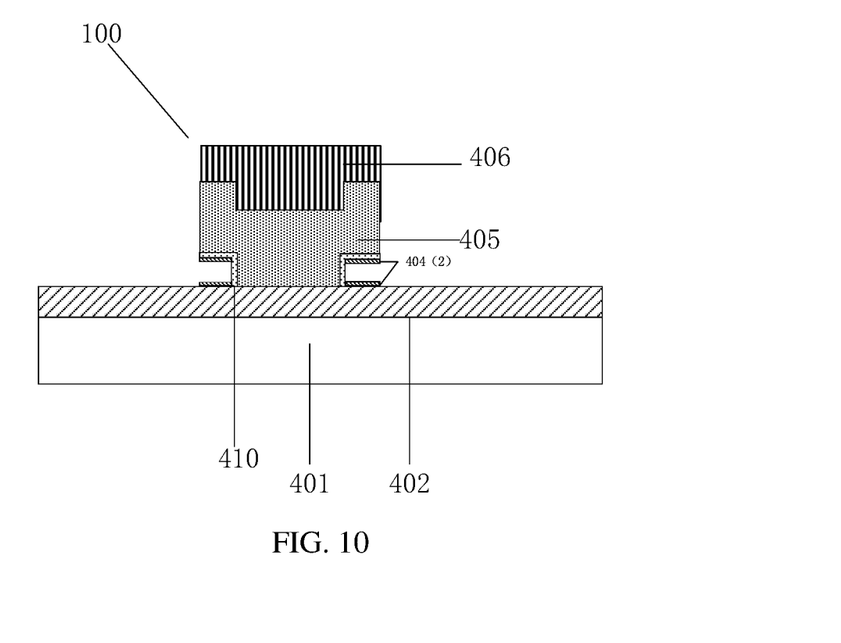
FIG. 10 is a schematic view illustratively showing a structure of another isolation column subsequent to being etched according to an embodiment of the present disclosure, in which a metal layer including two metal sub-layers separated from each other is shown.

In another embodiment, as shown in FIG. 10, the metal layer includes two metal sub-layers 404(2). The original intermediate metal sub-layer 404(1) is etched away, and the remaining two metal sub-layers 404(2) are separated from each other.

Embodiments of the present disclosure further provide a display apparatus including the above organic light-emitting display panel. A camera, a sensor and the like may be disposed in the opening.

Those skilled in the art will easily conceive other embodiments of the present disclosure after considering the specification and practicing the invention disclosed herein. The present application is intended to cover any variations, uses, or adaptive changes of the present disclosure. These variations, uses, or adaptive changes follow the general principles of the present disclosure and include common knowledge or conventional technical means in the art which is not disclosed in the present disclosure. The description and the embodiments are only regarded as exemplary, and the true scope and spirit of the present disclosure are set forth by the claims.

It should be understood that the present disclosure is not limited to the precise structure that has been described above and shown in the drawings, and various modifications and changes can be made without departing from its scope. The scope of the present disclosure is defined only by the appended claims.

What is claimed is:

1. An organic light-emitting display panel, comprising:
   a substrate having an opening passing through the substrate;
   a pixel array disposed on the substrate and comprising a plurality of pixels;
   an isolation part disposed between the plurality of pixels and the opening and surrounding the opening,
   wherein the isolation part comprises:
      a first layer disposed on the substrate, wherein the first layer comprises a first portion and a second portion which are sequentially stacked in a direction away from the substrate, and an orthogonal projection of the first portion on the substrate falls within an orthogonal projection of the second portion on the substrate; and
      a second layer disposed on a surface of the first layer away from the substrate,
   a metal layer, the metal layer is disposed on two sides of the first portion of the first layer in a direction parallel to the substrate, and the metal layer and a first metal layer of the plurality of pixels are a same metal layer, wherein
   the isolation part further comprises a protective layer disposed between the metal layer and the first layer, wherein the protective layer is in contact with a side of the second portion proximate to the substrate and the two sides of the first portion of the first layer in the direction parallel to the substrate, and a surface of the first portion facing the substrate, a surface of the protective layer facing the substrate, and a surface of the metal layer facing the substrate are aligned with one another in the direction parallel to the substrate; and
   a light emitting material layer of the organic light-emitting display panel is broken at the isolation part.

2. The organic light-emitting display panel of claim 1, wherein the metal layer is a titanium layer.

3. The organic light-emitting display panel of claim 1, wherein the metal layer comprises three metal sub-layers, the three metal sub-layers comprise a first metal sub-layer, a second metal sub-layer, and a third metal sub-layer which are sequentially arranged in the direction away from the substrate, a material of the first metal sub-layer is titanium, a material of the second metal sub-layer is aluminum, and a material of the third metal sub-layer is titanium.

4. The organic light-emitting display panel of claim 1, wherein the metal layer comprises two metal sub-layers which are sequentially arranged in the direction away from the substrate and are separated from each other.

5. The organic light-emitting display panel of claim 1, wherein a separation distance between the second portion and the substrate is greater than a thickness of a light emitting layer of the organic light-emitting display panel.

6. The organic light-emitting display panel of claim 1, further comprising: a frame sealing part disposed between the pixel array and the isolation part.

7. The organic light-emitting display panel of claim 1, wherein a material of the first layer comprises at least one of $SiO_2$, $SiN_x$, $SiON$, $Al_2O_3$, $TiO_2$, $Ta_2O_5$, $HfO_2$, or $ZnO$.

8. The organic light-emitting display panel of claim 1, wherein a material of the second layer is an organic material.

9. The organic light-emitting display panel of claim 1, wherein the first layer is an interlayer dielectric layer, and the second layer is a planarization layer.

10. A display apparatus comprising: the organic light-emitting display panel according to claim 1.

11. A method of manufacturing an organic light-emitting display panel, comprising:
   providing a substrate having a first region, a third region, and a second region between the first region and the third region;
   forming a plurality of pixels in the first region;
   forming an isolation part in the second region, the isolation part comprising: a first layer disposed on the substrate; and a second layer disposed on a surface of the first layer away from the substrate, wherein the first layer comprises a first portion and a second portion which are sequentially stacked in a direction away from the substrate, and an orthogonal projection of the first portion on the substrate falls within an orthogonal projection of the second portion on the substrate; and
   forming an opening passing through the substrate in the third region,
   wherein the steps of forming the plurality of pixels and the isolation part comprise:
   forming a metal layer on the substrate, the metal layer in the first region being formed into a gate electrode layer of the plurality of pixels;
   forming a channel passing through the metal layer in the metal layer in the second region;
   forming the first layer on the metal layer in the first region and the second region and in the channel; and
   forming the second layer on the first layer;
   wherein the step of forming the first layer on the metal layer in the first region and the second region and in the channel comprises: forming a protective layer on the metal layer in the second region before forming the first layer, wherein the protective layer is in contact with a side of the second portion proximate to the substrate and the two sides of the first portion of the first layer in the direction parallel to the substrate;

wherein a surface of the first portion facing the substrate, a surface of the protective layer facing the substrate, and a surface of the metal layer facing the substrate are aligned with one another in the direction parallel to the substrate; and a light emitting material layer of the organic light-emitting display panel is broken at the isolation part.

12. The method of claim 11, further comprising: etching an anode layer in the first region and the metal layer in the second region.

13. The method of claim 11, wherein the step of forming the first layer on the metal layer in the first region and the second region comprises: forming the first layer such that a separation distance between the second portion and the substrate is greater than a thickness of a light emitting layer of the organic light-emitting display panel.

* * * * *